US011239873B2

(12) United States Patent
Mori

(10) Patent No.: US 11,239,873 B2
(45) Date of Patent: Feb. 1, 2022

(54) FRONT-END CIRCUIT AND COMMUNICATION DEVICE

(71) Applicant: MURATA MANUFACTURING CO., LTD., Kyoto (JP)

(72) Inventor: Hirotsugu Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/830,992

(22) Filed: Mar. 26, 2020

(65) Prior Publication Data

US 2020/0313710 A1     Oct. 1, 2020

(30) Foreign Application Priority Data

Mar. 28, 2019  (JP) .............................. JP2019-063331

(51) Int. Cl.
*H04B 1/16* (2006.01)
*H03H 7/01* (2006.01)
*H03F 3/189* (2006.01)

(52) U.S. Cl.
CPC .............. *H04B 1/16* (2013.01); *H03F 3/189* (2013.01); *H03H 7/0115* (2013.01); *H03F 2200/165* (2013.01); *H03F 2200/294* (2013.01); *H03F 2200/451* (2013.01)

(58) Field of Classification Search
CPC combination set(s) only.
See application file for complete search history.

(56) References Cited

U.S. PATENT DOCUMENTS

| 2016/0087587 | A1   | 3/2016  | Wang et al.              |
| 2016/0127015 | A1   | 5/2016  | Wloczysiak et al.        |
| 2017/0222694 | A1   | 8/2017  | Tota                     |
| 2019/0149131 | A1 * | 5/2019  | Kido ............... H03H 9/145 455/338 |
| 2019/0181838 | A1 * | 6/2019  | Nosaka ............ H03H 9/6403 |
| 2019/0288723 | A1 * | 9/2019  | Takaike ........... H04N 21/4425 |
| 2020/0395960 | A1 * | 12/2020 | Mori ................. H04B 1/0057 |

FOREIGN PATENT DOCUMENTS

| GN | 106876832 A   | 6/2017  |
| JP | 2017-135610 A | 8/2017  |
| JP | 2017-535118 A | 11/2017 |

OTHER PUBLICATIONS

Chinese Office action for Application No. 202010219216.2 dated Jun. 25, 2021.

* cited by examiner

*Primary Examiner* — Thanh C Le
(74) *Attorney, Agent, or Firm* — Pearne & Gordon LLP

(57) ABSTRACT

A front-end circuit includes: a power divider that performs power division on a radio frequency signal inputted to an input terminal, using a predetermined division ratio, and outputs resultant radio frequency signals from output terminals; a filter connected to one of the output terminals and having a first passband; and a filter connected to the other of the output terminals and having a second passband having a frequency range that at least overlaps a frequency range of the first passband.

20 Claims, 12 Drawing Sheets

FRONT-END CIRCUIT AND COMMUNICATION DEVICE

CROSS REFERENCE TO RELATED APPLICATION

The present application is based on and claims priority of Japanese Patent Application No. 2019-063331 filed on Mar. 28, 2019. The entire disclosure of the above-identified application, including the specification, drawings and claims is incorporated herein by reference in its entirety.

FIELD

The present disclosure relates to a front-end circuit, and a communication device including the front-end circuit.

BACKGROUND

There has been a demand that a front-end circuit that is multiband and multimode compatible simultaneously transfer radio frequency signals with low loss.

Patent Literature (PTL) 1 (U.S. Unexamined Patent Application Publication No. 2016/0127015) discloses a receiver module having a configuration in which filters having different passbands are connected to an antenna via a multiplexer.

SUMMARY

Technical Problem

In the receiver module disclosed in PTL 1, however, when the passbands of the filters at least partially overlap each other, a configuration in which the multiplexer is simply disposed upstream of the filters results in insufficient isolation between the filters. For this reason, when the passbands of the filters at least partially overlap each other, it is difficult to simultaneously transfer radio frequency signals that have passed through the filters.

The present disclosure has been made to solve the above problem, and is intended to provide a front-end circuit and a communication device that simultaneously transfer radio frequency signals having frequency bands that at least partially overlap each other.

Solution to Problem

A front-end circuit according to one aspect of the present disclosure is a front-end circuit that includes: a first power divider that includes a first input terminal, a first output terminal, and a second output terminal, performs power division on a radio frequency signal inputted to the first input terminal, using a predetermined division ratio, and outputs a resultant radio frequency signal from each of the first output terminal and the second output terminal; a first filter that is connected to the first output terminal and has a first passband; and a second filter that is connected to the second output terminal and has a second passband having a frequency range that at least partially overlaps a frequency range of the first passband.

Advantageous Effects

The present disclosure provides a front-end circuit and a communication device that simultaneously transfer radio frequency signals having frequency bands that at least partially overlap each other.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
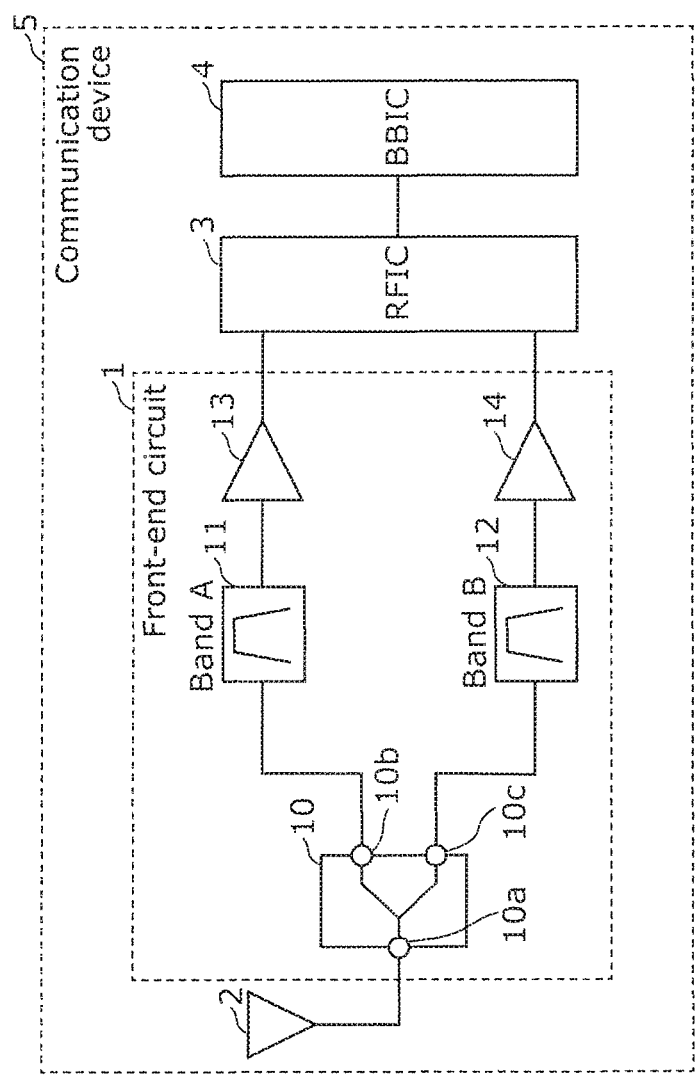
FIG. 1 is a circuit configuration diagram illustrating a front-end circuit and a communication device according to Embodiment 1.

Hereinafter, embodiments of the present disclosure will be described in detail with reference to the drawings. It should be noted that each of the embodiments described below shows a general or specific example. The numerical values, shapes, materials, constituent elements, the arrangement and connection of the constituent elements, etc. indicated in the following embodiments are mere examples, and therefore are not intended to limit the present disclosure. Thus, among the constituent elements in the following embodiments, those not recited in any independent claim are described as optional constituent elements. In addition, the sizes of constituent elements and the ratios of the sizes illustrated in the drawings are not necessarily strictly accurate.

Embodiment 1

[1.1 Configurations of Front-End Circuit 1 and Communication Device 5]

FIG. 1 is a circuit configuration diagram illustrating front-end circuit 1 and communication device 5 according to Embodiment 1. As illustrated in FIG. 1, communication device 5 includes front-end circuit 1, antenna 2, radio frequency signal processing circuit (RFIC) 3, and baseband signal processing circuit (BBIC) 4.

RFIC 3 processes radio frequency signals transmitted and received by antenna 2. Specifically, RFIC 3 processes a radio frequency received signal inputted via a received signal path of front-end circuit 1, by down-conversion, for example, and outputs a received signal generated by being processed to BBIC 4. In addition, RFIC 3 may further process a signal to be transmitted inputted from BBIC 4, by up-conversion, for example, and output a radio frequency transmission signal generated by being processed to a transmission signal path.

Moreover, RFIC 3 may include a controller that controls a gain of an amplifier and ON and OFF of a switch included in front-end circuit 1, in accordance with at least one of a frequency of a radio frequency signal transferred through communication device 5, the receiving sensitivity of front-end circuit 1, or the antenna sensitivity of antenna 2. It should be noted that the controller may be disposed outside RFIC 3, and may be provided in, for example, front-end circuit 1 or BBIC 4.

BBIC 4 performs signal processing using an intermediate frequency band lower than the frequency band of a radio frequency signal transferred through front-end circuit 1. A signal processed by BBIC 4 is used as, for example, an image signal for displaying an image or an audio signal for talking via a loudspeaker.

Antenna 2 is connected to input terminal 10a of power divider 10. Antenna 2 receives a radio frequency signal from outside and outputs the radio frequency signal to front-end circuit 1, and radiates a radio frequency signal outputted from RFIC 3.

It should be noted that in communication device 5 according to the present embodiment, antenna 2 and BBIC 4 are not essential constituent elements.

Front-end circuit 1 includes power divider 10, filters 11 and 12, and low-noise amplifiers 13 and 14.

Power divider 10 is an example of a first power divider, and includes input terminal 10a (first input terminal), output terminal 10b (first output terminal), and output terminal 10c (second output terminal). Power divider 10 performs power division on a radio frequency signal inputted to input terminal 10, using a predetermined division ratio, and outputs one of radio frequency signals resulting from the power division from output terminal 10b, and the other of the radio frequency signals from output terminal 10c. It should be noted that a division ratio between the power of the radio frequency signal outputted from output terminal 10b and the power of the radio frequency signal outputted from output terminal 10c is 1:1 (each decreased by 3 dB), for example. However, the division ratio is not limited to this. It should be noted that radio frequency components (a frequency spectrum) of the radio frequency signal outputted from output terminal 10b are identical to radio frequency components (a frequency spectrum) of the radio frequency signal outputted from output terminal 10c.

Filter 11 is an example of a first filter, and has a first passband. The first passband corresponds to Band A (communication band A), for example. Filter 11 has an input end connected to output terminal 10b, and an output end connected to an input end of low-noise amplifier 13.

Filter 12 is an example of a second filter, and has a second passband having a frequency range that at least partially overlaps a frequency range of the first passband. The second passband corresponds to Band B (communication band B), for example. Filter 12 has an input end connected to output terminal 10c, and an output end connected to an input end of low-noise amplifier 14.

It should be noted that filters 11 and 12 may each be, for example, any of an acoustic wave filter that uses surface acoustic waves (SAWs), an acoustic wave filter that uses bulk acoustic waves (BAWs), an LC resonant filter, an LC resonant circuit including an acoustic wave resonator, and a dielectric filter. Further, filters 11 and 12 are not limited to these.

Low-noise amplifier 13 is an example of a first low-noise amplifier, and preferentially amplifies a radio frequency signal in the first passband outputted from filter 11.

Low-noise amplifier 14 is an example of a second low-noise amplifier, and preferentially amplifies a radio frequency signal in the second passband outputted from filter 12.

Low-noise amplifiers 13 and 14 are each configured as, for example, a silicon (Si) complementary metal oxide semiconductor (CMOS), a Gallium Arsenide (GaAs) field-effect transistor (FET), or a hetero bipolar transistor (HBT).

It should be noted that in front-end circuit 1 according to the present embodiment, power divider 10 and filters 11 and 12 are essential constituent elements, but low-noise amplifiers 13 and 14 are not essential constituent elements.

Figure 2A:
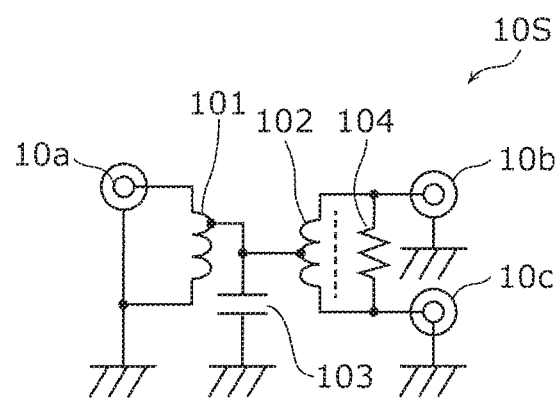
FIG. 2A is a diagram illustrating an example of the first circuit configuration of a power divider according to Embodiment 1.

FIG. 2A is a diagram illustrating an example of the first circuit configuration of power divider 10 according to Embodiment 1. Power divider 10 included in front-end circuit 1 is realized by power divider 105 illustrated in FIG. 2A, for example.

Power divider 105 includes input terminal 10a, output terminals 10b and 10c, input transformer 101, output transformer 102, capacitor 103, and resistor 104. Power divider 105 is a hybrid of a transformer power divider and a resistor power divider. Specifically, an intermediate node of output transformer 102 that has transformed impedance to 100Ω is connected to a node of input transformer 101 that has transformed impedance from 50Ω to 25Ω, and resistor 104 connected to output transformer 102 and having 100Ω keeps output states of output terminals 10b and 10c in balance.

Figure 2B:
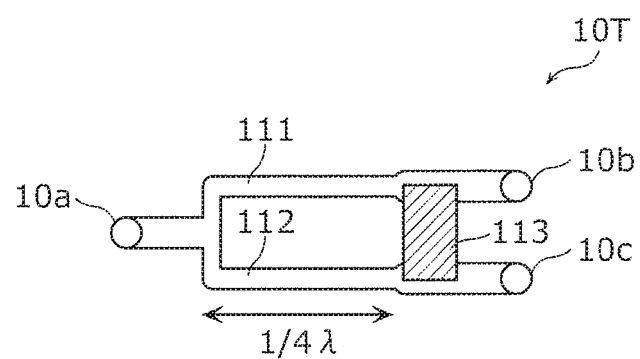
FIG. 2B is a diagram illustrating an example of the second circuit configuration of the power divider according to Embodiment 1.

FIG. 2B is a diagram illustrating an example of the second circuit configuration of power divider 10 according to Embodiment 1. Power divider 10 included in front-end circuit 1 is realized by power divider 10T illustrated in FIG. 2B, for example.

Power divider 10T includes input terminal 10a, output terminals 10b and 10c, (¼) λ striplines 111 and 112, and resistor 113. Power divider 10T is a Wilkinson power divider, and is used to perform power division on mainly a radio frequency signal having at least several GHz.

According to the above configurations of front-end circuit 1 and communication device 5 according to the present embodiment, power divider 10 ensures favorable isolation of a radio frequency signal in communication band A and a radio frequency signal in communication band B that have frequency bands at least partially overlapping each other. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals.

It should be noted that due to the placement of power divider 10, each of the radio frequency signal passing through filter 11 and the radio frequency signal passing through filter 12 has low power, compared to a radio frequency signal inputted to power divider 10. In this case, since front-end circuit 1 includes low-noise amplifiers 13 and 14, low-noise amplifiers 13 and 14 amplify with low noise the radio frequency signal having passed through filter 11 and the radio frequency signal having passed through filter 12, respectively. As a result, when the passbands of filters 11 and 12 at least partially overlap each other, it is possible to simultaneously transfer the radio frequency signal having passed through filter 11 and the radio frequency signal having passed through filter 12, without attenuating power thereof.

It should be noted that at least one of a division ratio of power divider 10, gains of low-noise amplifiers 13 and 14, or the frequency ranges of the passbands of filters 11 and 12 may be caused to change dynamically in accordance with at least one of the frequency ranges of communication bands A and B, the receiving sensitivity of communication device 5, or the antenna sensitivity of antenna 2. With this, it is possible to improve the receiving sensitivity of front-end circuit 1 and communication device 5.

In other words, power divider 10 may be a variable power divider having a variable division ratio, low-noise amplifiers 13 and 14 may each be a variable amplifier having a variable gain, and filters 11 and 12 may each be a variable filter having a variable passband.

[1.2 Configurations of Front-End Circuit 1 and Communication Device 5 According to Variation 1]

Figure 3:
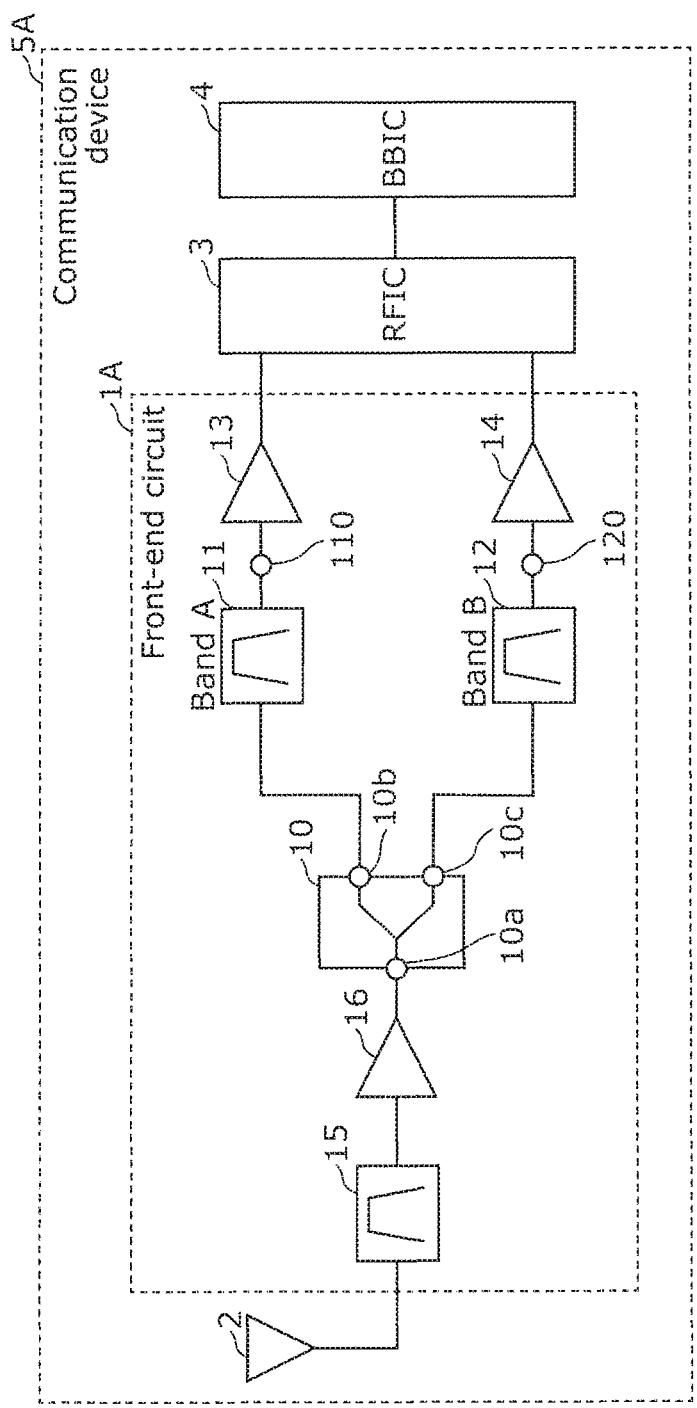
FIG. 3 is a circuit configuration diagram illustrating a front-end circuit and a communication device according to Variation 1 of Embodiment 1.

FIG. 3 is a circuit configuration diagram illustrating front-end circuit 1A and communication device 5A according to Variation 1 of Embodiment 1. As illustrated in FIG. 3, communication device 5A includes front-end circuit 1A, antenna 2, RFIC 3, and BBIC 4.

Communication device 5A according to the present variation differs from communication device 5 according to Embodiment 1 only in the configuration of front-end circuit 1A. Further, front-end circuit 1A according to the present variation differs from front-end circuit 1 according to Embodiment 1 in that filter 15 and low-noise amplifier 16 are added. In what follows, a description of similarities in configuration between front-end circuit 1A and communication device 5A according to the present variation and front-end circuit 1 and communication device 5 according to Embodiment 1 is omitted, and differences in configuration therebetween are mainly described.

Front-end circuit 1A includes power divider 10, filters 11, 12, and 15, and low-noise amplifiers 13 and 14.

Power divider 10 is an example of the first power divider, and includes input terminal 10a (first input terminal), output terminal 10b (first output terminal), and output terminal 10c (second output terminal).

Filter 15 is an example of a third filter, and has a third passband. The third passband encompasses the first passband of filter 11 and the second passband of filter 12. It should be noted that filter 15 may be, for example, any of an acoustic wave filter that uses SAWs, an acoustic wave filter that uses BAWs, an LC resonant filter, an LC resonant circuit including an acoustic wave resonator, and a dielectric filter. Further, filter 15 is not limited to these.

Low-noise amplifier 16 is an example of a third low-noise amplifier, and preferentially amplifies a radio frequency signal in the third passband outputted from filter 15. It should be noted that low-noise amplifier 16 is configured as, for example, a Si CMOS, a GaAs field-effect transistor (FET), or a hetero bipolar transistor (HBT).

Low-noise amplifier 16 has an output end connected to input terminal 10a of power divider 10, and an input end connected to an output end of filter 15. Filter 15 has an input end connected to antenna 2. Filter 11 has an input end connected to output terminal 10b of power divider 10, and an output end connected to an input end of low-noise amplifier 13. Filter 12 has an input end connected to output terminal 10c of power divider 10, and an output end connected to an input end of low-noise amplifier 14.

Front-end circuits 1 and 1A and communication devices 5 and 5A support a communication scheme in which different communication systems are simultaneously used. Examples of the different communication systems include the fourth generation communication system (4G) and the fifth generation communication system (5G).

In Non-StandAlone New Radio (NSA-NR) that is communication architecture being introduced in recent years, a 5G New Radio (NR) communication area is established in a 4G Long-Term Evolution (LTE) communication area, and communication control in conformance to both 5G NR and 4G LTE is performed using a 4G LTE control channel. It should be noted that NSA is defined in, for example, TR 38.801 that is a technical report on network architecture.

For the above reason, NSA-NR relies on simultaneously connecting a 4G LTE transfer circuit and a 5G NR transfer circuit to a communication line, using 4G LTE as a master and 5G NR as a slave (EN-DC: LTE-NR Dual Connectivity).

In order to achieve this, in front-end circuit 1A and communication device 5A according to the present variation, a 4G LTE transfer circuit and a 5G NR transfer circuit are connected to one antenna 2. The 4G LTE transfer circuit includes, for example, output terminal 10c, filter 12, and reception terminal 120. The 5G NR transfer circuit includes, for example, output terminal 10b, filter 11, and reception terminal 110. For example, Band 41 (transmission and receiving band: 2496 to 2690 MHz) of 4G LTE is applied to Band B (second passband), and n 41 (transmission and receiving band: 2496 to 2690 MHz) of 5G NR is applied to Band A (first passband). In this case, Band B (second passband) and Band A (first passband) have the same frequency range. It should be noted that in this case, frequency components (a frequency spectrum) of a radio frequency signal passing through filter 11 are different from frequency components (a frequency spectrum) of a radio frequency signal passing through filter 12. Specifically, for example, the center frequency of a channel signal transmitted in Band 41 of 4G LTE is different from the center frequency of a channel signal transmitted in n 41 of 5G NR. RFIC 3 extracts data of 5G from the radio frequency signal having passed through filter 11, and extracts data of 4G from the radio frequency signal having passed through filter 12.

It should be noted that the front-end circuit and the communication device according to the present disclosure conform to TS 38.101-3, a technical specification, in which a combination of communication bands that at least partially overlap each other, as illustrated by Band 41 of 4G LTE and n 41 of 5G NR, is defined.

Figure 4A:
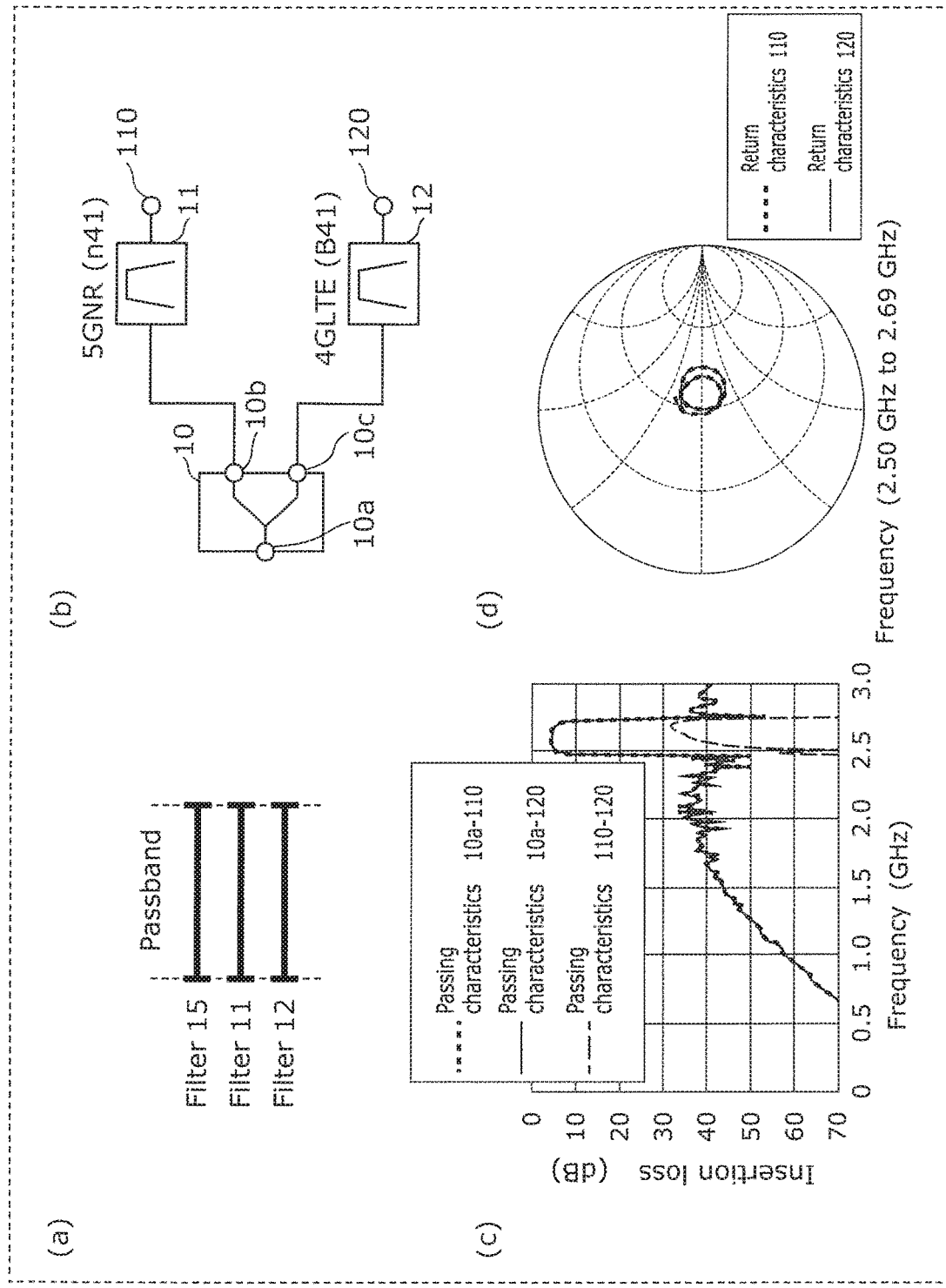
FIG. 4A is a diagram illustrating a circuit configuration, passing characteristics, and return characteristics of the front-end circuit according to Variation 1 of Embodiment 1.

FIG. 4A is a diagram illustrating a circuit configuration, passing characteristics, and return characteristics of front-end circuit 1A according to Variation 1 of Embodiment 1. FIG. 4A illustrates a frequency relationship between the passbands of filters 11, 12, and 15 included in front-end circuit 1A according to Variation 1 of Embodiment 1 (as shown in the upper-left); a circuit (hereinafter referred to as a power divider circuit) obtained by extracting power divider 10 and filters 11 and 12 from front-end circuit 1A according to Variation 1 of Embodiment 1 (as shown in the upper-right); passing characteristics of the power divider circuit (as shown in the bottom-left); and return (impedance) characteristics of the power divider circuit (as shown in the bottom-right).

Figure 4B:
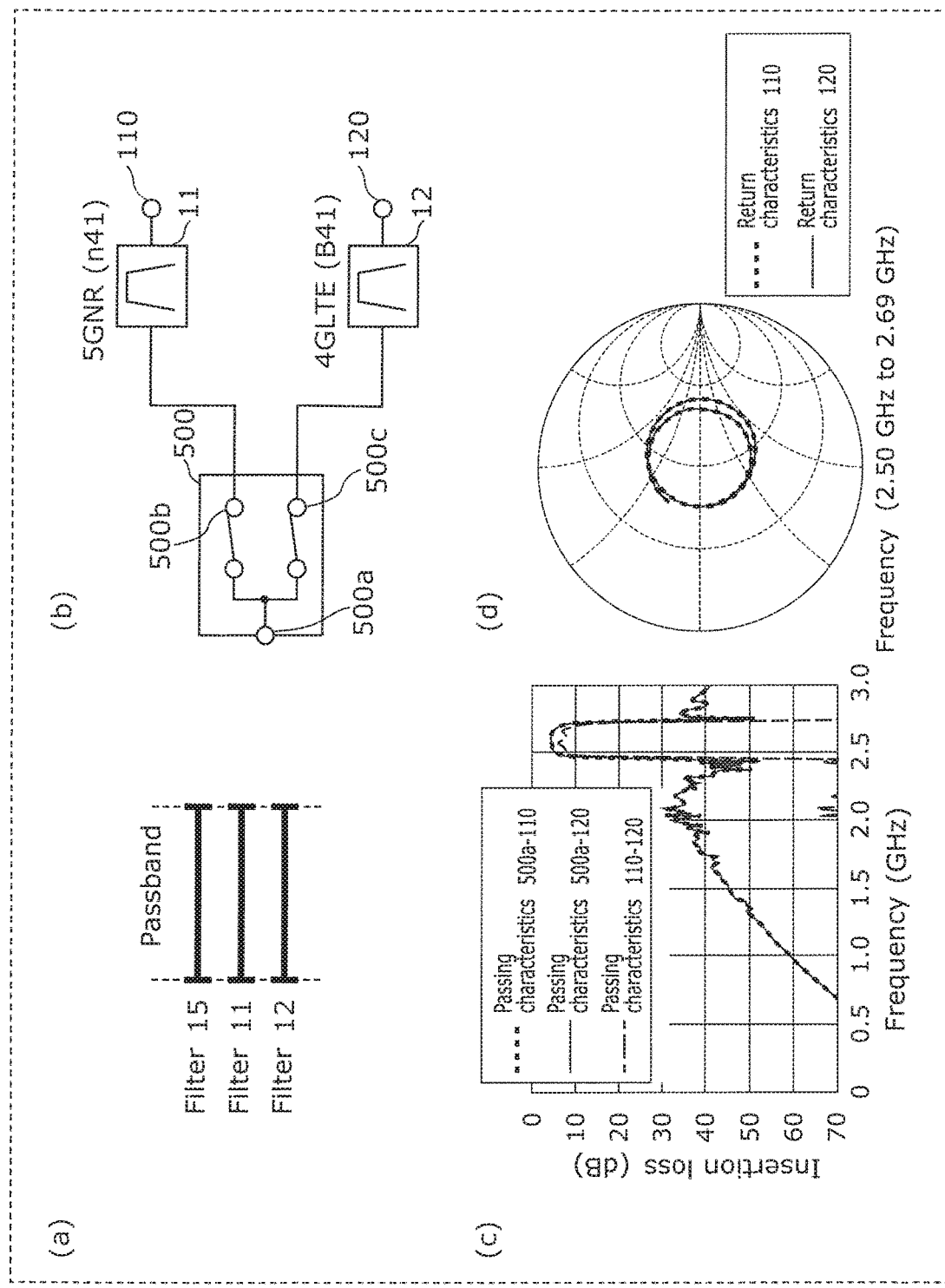
FIG. 4B is a diagram illustrating a circuit configuration, passing characteristics, and return characteristics of a front-end circuit according to a comparative example.

FIG. 4B is a diagram illustrating a circuit configuration, passing characteristics, and return characteristics of a front-end circuit according to a comparative example. It should be noted that the front-end circuit according to the comparative example differs from front-end circuit 1A according to Variation 1 of Embodiment 1 only in that switch 500 is disposed in place of power divider 10. FIG. 4B illustrates a frequency relationship between the passbands of filters 11, 12, and 15 included in the front-end circuit according to the comparative example (as shown in the upper-left); illustrates a circuit (hereinafter referred to as a switch circuit) obtained by extracting switch 500 and filters 11 and 12 from the front-end circuit according to the comparative example (as shown in the upper-right); passing characteristics of the switch circuit (as shown in the bottom-left); and return (impedance) characteristics of the switch circuit (as shown in the bottom-right).

As illustrated in FIG. 4A and FIG. 4B, in both front-end circuit 1A according to the present variation and the front-end circuit according to the comparative example, filters 11, 12, and 15 have the same passband. As further illustrated in FIG. 4B, in the front-end circuit according to the comparative example, in order to achieve 5G NR and 4G LTE EN-DC, switch 500 connects common terminal 500*a* and selection terminal 500*b*, and connects common terminal 500*a* and selection terminal 500*c*.

As further illustrated in FIG. 4B, in the front-end circuit according to the comparative example, the passing characteristics of filters 11 and 12 are favorable, but isolation in the first passband (and the second passband) between filters 11 and 12 is at most 10 dB and has deteriorated. As further illustrated in FIG. 4B, this deterioration of the isolation causes a variation in impedance of the first passband (and the second passband) in reception terminals 110 and 120 to be greater (a degree of concentration of a spiral to be lower), and causes an impedance mismatch between filters 11 and 12 and low-noise amplifiers 13 and 14 disposed downstream to be greater. Consequently, it is not possible to simultaneously transfer a 4G LTE radio frequency signal and a 5G NR radio frequency signal at high quality. It should be noted that "a degree of concentration of a spiral" refers to a degree of concentration of a locus of impedances on a Smith chart.

In contrast, as illustrated in FIG. 4A, in front-end circuit 1A according to the present variation, the passing characteristics of filters 11 and 12 are favorable, and isolation in the first passband (and the second passband) between filters 11 and 12 is maintained at at least 30 dB. As further illustrated in FIG. 4A, the favorable isolation characteristics cause a variation in impedance of the first passband (and the second passband) in reception terminals 110 and 120 to be small (a degree of concentration of a spiral to be higher), and cause an impedance match between filters 11 and 12 and low-noise amplifiers 13 and 14 disposed downstream to be favorable. Consequently, it is possible to simultaneously transfer a 4G LTE radio frequency signal and a 5G NR radio frequency signal at high quality.

In front-end circuit 1A and communication device 5A according to the present variation, low-noise amplifier 16 is disposed upstream of power divider 10. Since low-noise amplifiers 13 and 14 disposed downstream of power divider 10 amplify radio frequency signals having S/N ratios that are reduced as a result of having passed through power divider 10 and filters 11 and 12, the radio frequency signals are amplified while the reduced S/N ratios are maintained. In contrast, since low-noise amplifier 16 disposed upstream of power divider 10 amplifies a radio frequency signal having an S/N ratio that is not reduced, upstream of power divider 10, it is possible to avoid the reduction of the S/N ratio of the radio frequency signal to be outputted from front-end circuit 1A to RFIC 3.

When low-noise amplifier 16 is disposed upstream of power divider 10, filter 15 is desirably disposed. Accordingly, it is possible to reduce distortion in low-noise amplifier 16 caused by unnecessary radio frequency components other than the third passband.

It should be noted that in front-end circuit 1A according to the present variation, when a gain of low-noise amplifier 16 is sufficiently large, low-noise amplifiers 13 and 14 need not be included.

Moreover, at least one of the gain of low-noise amplifier 16 or the frequency range of the passband of filter 15 may be caused to change dynamically in accordance with at least one of the frequency ranges of communication bands A and B, the receiving sensitivity of front-end circuit 1A, or the antenna sensitivity of antenna 2. With this, it is possible to improve the receiving sensitivity of front-end circuit 1A and communication device 5A.

In other words, low-noise amplifier 16 may be a variable amplifier having a variable gain, and filter 15 may be a variable filter having a variable passband.

[1.3 Configuration of Front-End Circuit According to Variation 2]

Figure 5:
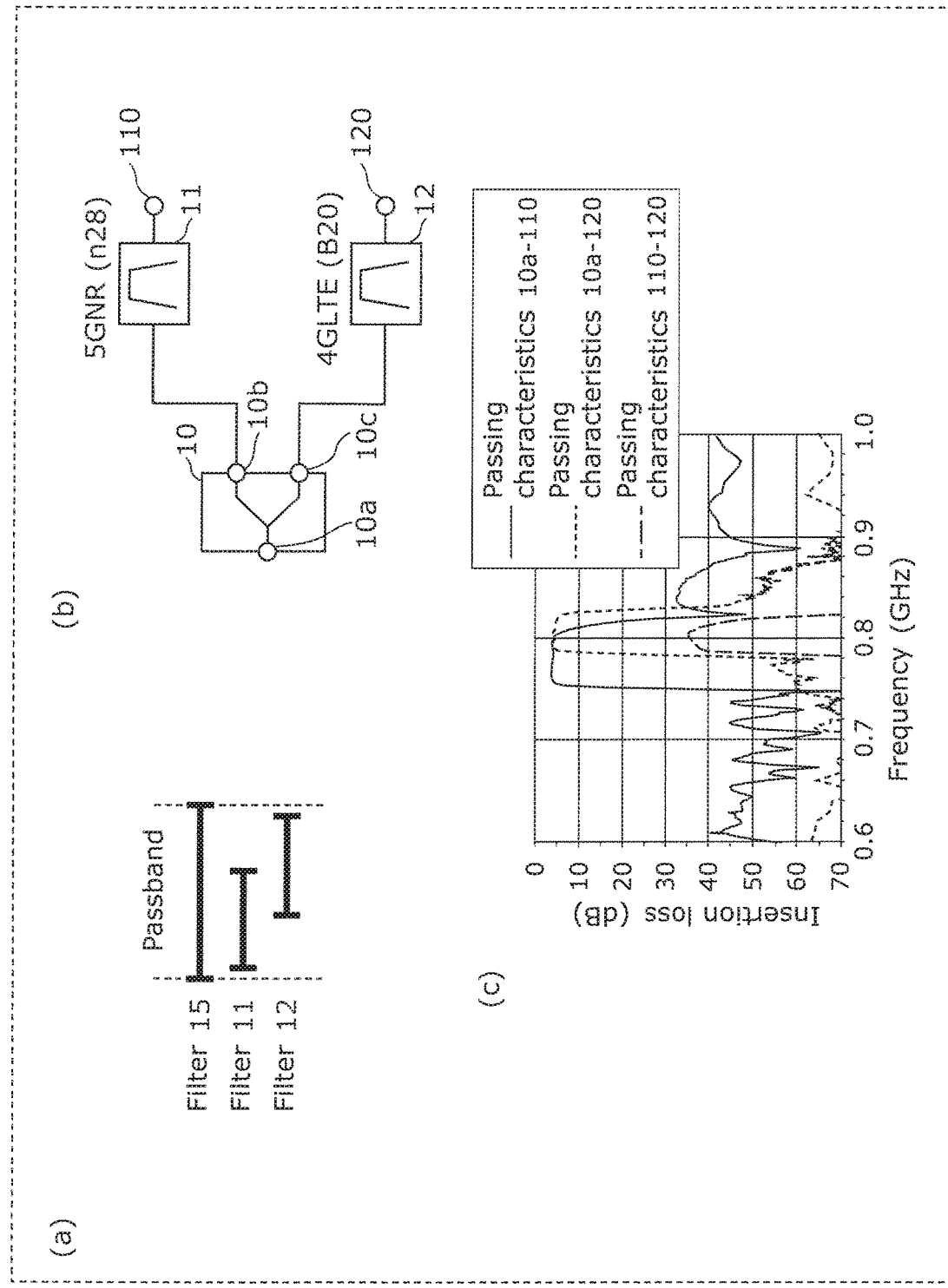
FIG. 5 is a diagram illustrating a circuit configuration and passing characteristics of a front-end circuit according to Variation 2 of Embodiment 1.

FIG. 5 is a diagram illustrating a circuit configuration and passing characteristics of a front-end circuit according to Variation 2 of Embodiment 1. The front-end circuit according to the present variation differs from front-end circuit 1A according to Variation 1 of Embodiment 1 only in the frequency relationship between the passbands of filters 11 and 12. In what follows, a description of similarities in configuration between the front-end circuit according to the present variation and front-end circuit 1A according to Variation 1 of Embodiment 1 is omitted, and differences in configuration therebetween are mainly described.

In the front-end circuit according to the present variation, for example, Band 20 (receiving band: 791 to 892 MHz) of 4G LTE is applied to Band B (second passband) of filter 12, and n 28 (receiving band: 758 to 803 MHz) of 5G NR is applied to Band A (first passband) of filter 11. In this case, Band B (second passband) and Band A (first passband) have the frequency ranges that include an overlapping portion (791 to 803 MHz) and non-overlapping portions (758 to 791 MHz, 803 to 892 MHz). The third passband of filter 15 encompasses a band (758 to 892 MHz) encompassing Band A (first passband) and Band B (second passband).

According to the above configuration, as illustrated in FIG. 5, the passing characteristics of filters 11 and 12 are favorable, but isolation in the first passband and the second passband between filters 11 and 12 is maintained at at least 30 dB. The favorable isolation characteristics cause a variation in impedance of the first passband and the second passband in reception terminals 110 and 120 to be small (a degree of concentration of a spiral to be higher), and cause an impedance match between filters 11 and 12 and low-noise amplifiers 13 and 14 disposed downstream to be favorable. Consequently, it is possible to simultaneously transfer a 4G LTE radio frequency signal and a 5G NR radio frequency signal at high quality.

[1.4 Configurations of Front-End Circuit 1B and Communication Device 5B According to Variation 3]

Figure 6:
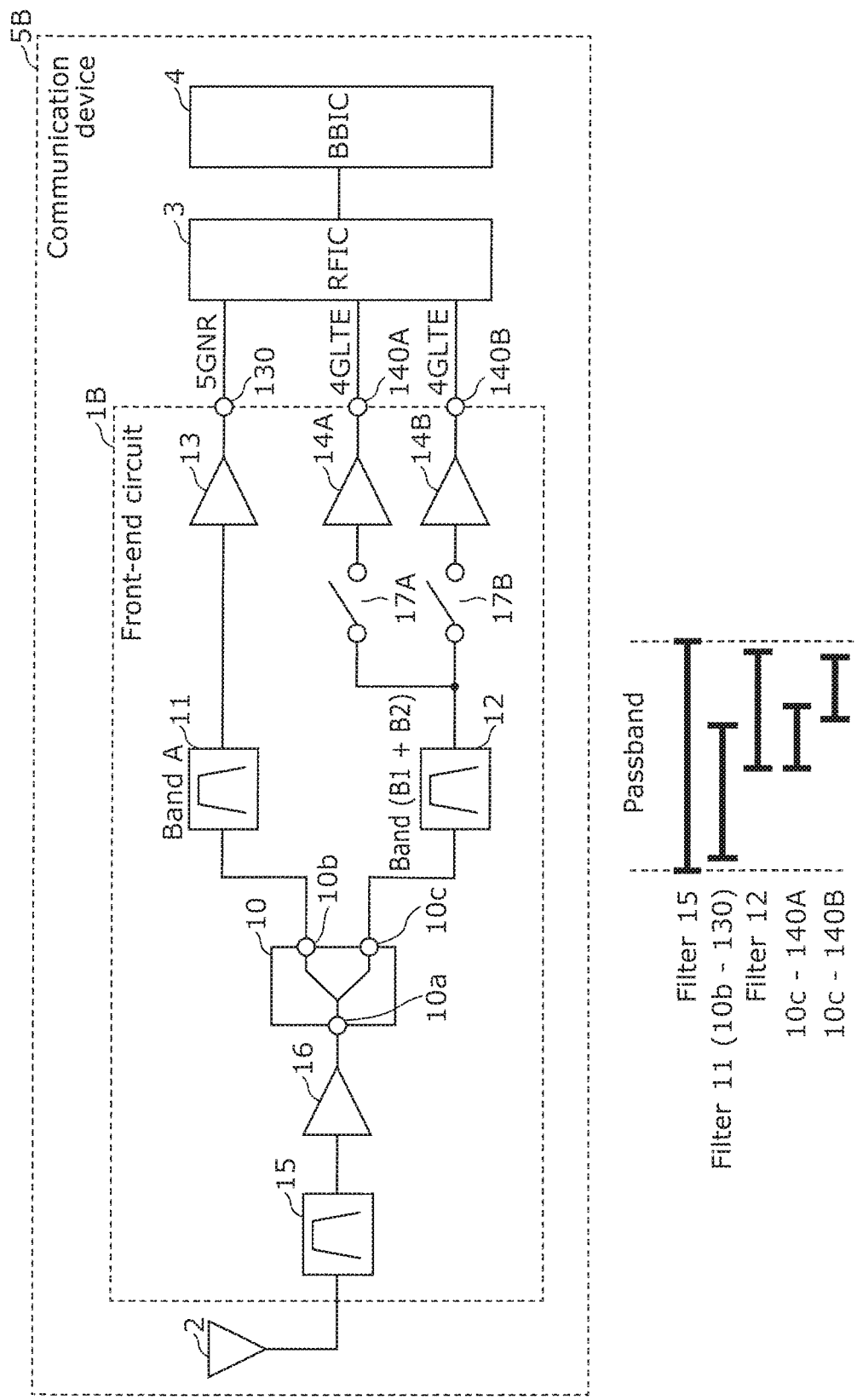
FIG. 6 is a circuit configuration diagram illustrating a front-end circuit and a communication device according to Variation 3 of Embodiment 1.

FIG. 6 is a circuit configuration diagram illustrating front-end circuit 1B and communication device 5B according to Variation 3 of Embodiment 1. As illustrated in FIG. 6, communication device 5B includes front-end circuit 1B, antenna 2, RFIC 3, and BBIC 4. Communication device 5B according to the present variation differs from communication device 5A according to Variation 1 of Embodiment 1 only in the configuration of front-end circuit 1B. Front-end circuit 1B according to the present variation differs from front-end circuit 1A according to Variation 1 of Embodiment 1 in that a switch and two low-noise amplifiers are disposed downstream of filter 12, and in a frequency relationship between passbands of filters. In what follows, a description of similarities in configuration between front-end circuit 1B and communication device 5B according to the present variation and front-end circuit 1A and communication device 5A according to Variation 1 of Embodiment 1 is omitted, and differences in configuration therebetween are mainly described.

Front-end circuit 1B includes power divider 10, filters 11, 12, and 15, low-noise amplifiers 13, 14A, 14B, and 16, and switches 17A and 17B.

Filter 11 is an example of the first filter, and has a first passband. The first passband corresponds to Band A (communication band A) of 5G NR, for example.

Filter 12 is an example of the second filter, and has a second passband having a frequency range that at least partially overlaps a frequency range of the first passband. The second passband encompasses, for example, Band B1 (communication band B1) of 4G LTE and Band B2 (communication band B2) of 4G LTE. Filter 12 has an input end connected to output terminal 10c, and an output end connected to one ends of switches 17A and 17B.

Low-noise amplifier 14A is an example of the second low-noise amplifier, and preferentially amplifies a radio frequency signal in Band B1 outputted from filter 12. Low-noise amplifier 14B is an example of the second low-noise amplifier, and preferentially amplifies a radio frequency signal in Band B2 outputted from filter 12. It should be noted that low-noise amplifiers 14A and 14B are each configured as, for example, a Si CMOS, a GaAs field-effect transistor (FET), or a hetero bipolar transistor (HBT).

Low-noise amplifier 14A has an input end connected to the other end of switch 17A, and an output end connected to reception output terminal 140A. Low-noise amplifier 14B has an input end connected to the other end of switch 17B, and an output end connected to reception output terminal 140B.

The first passband (Band A) of filter 11 and the second passband (Band B1+B2) of filter 12 have frequency ranges that partially overlap each other. More specifically, the first passband (Band A) of filter 11 and Band B1 of 4G LTE have frequency ranges that partially overlap each other. Band B1 and Band B2 of 4G LTE have frequency ranges that partially overlap each other.

Here, switches 17A and 17B do not simultaneously become conductive. In other words, a radio frequency signal in Band B1 of 4G LTE and a radio frequency signal in Band B2 of 4G LTE are not simultaneously transferred.

According to the above configuration, when switch 17A is conductive, a radio frequency signal in Band A of 5G NR and the radio frequency signal in Band B1 of 4G LTE are simultaneously transferred. Moreover, when switch 17B is conductive, the radio frequency signal in Band A of 5G NR and the radio frequency signal in Band B2 of 4G LTE are simultaneously transferred.

According to the above configurations of front-end circuit 1B and communication device 5B according to the present variation, power divider 10 ensures favorable isolation of the radio frequency signal in Band A of 5G NR and the radio frequency signal in Band B1 of 4G LTE that have frequency bands at least partially overlapping each other. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals. In addition, the configurations make it possible to simultaneously select a communication band of 4G LTE and transfer the radio frequency signal in Band A of 5G NR.

[1.5 Configurations of Front-End Circuit 1C and Communication Device 5C According to Variation 4]

Figure 7:
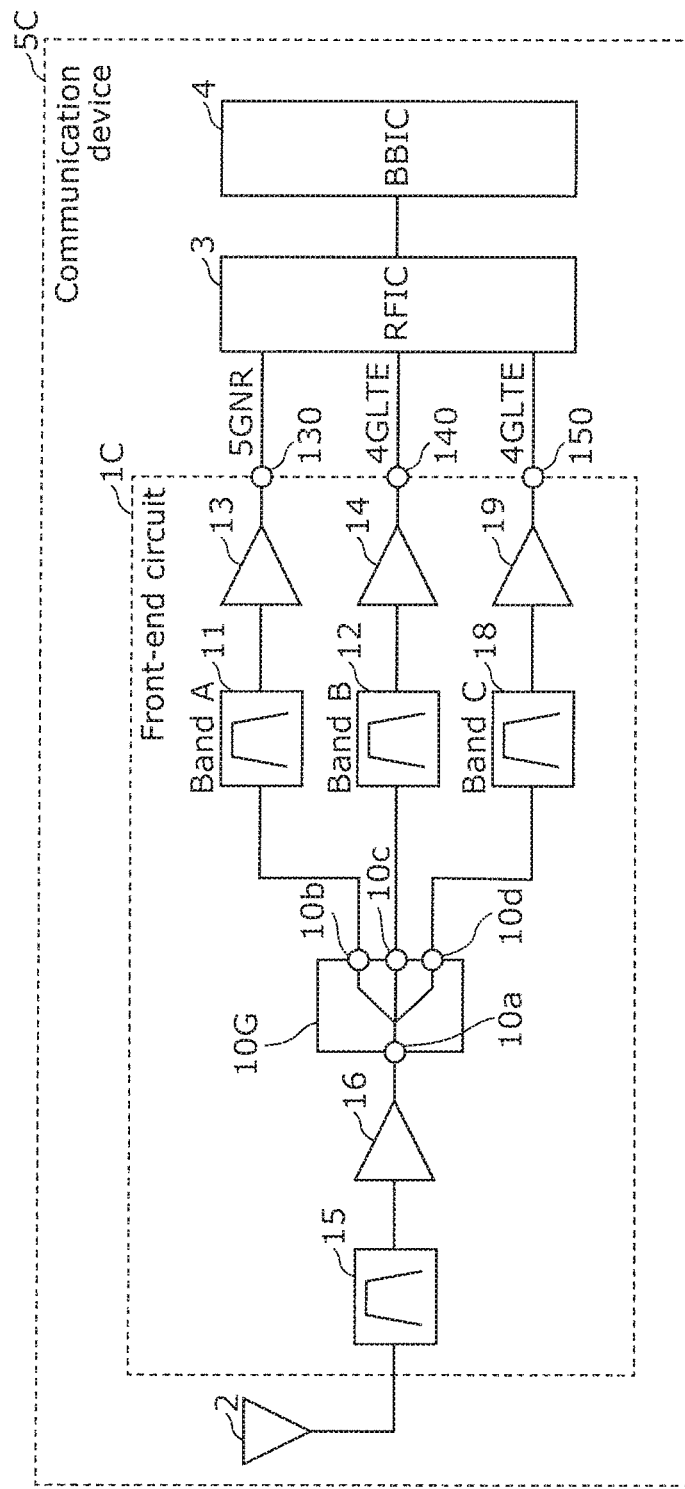
FIG. 7 is a circuit configuration diagram illustrating a front-end circuit and a communication device according to Variation 4 of Embodiment 1.

FIG. 7 is a circuit configuration diagram illustrating front-end circuit 1C and communication device 5C according to Variation 4 of Embodiment 1. As illustrated in FIG. 7, communication device 5C includes front-end circuit 1C, antenna 2, RFIC 3, and BBIC 4. Communication device 5C according to the present variation differs from communication device 5A according to Variation 1 of Embodiment 1 only in the configuration of front-end circuit 1C. Front-end circuit 1C according to the present variation differs from front-end circuit 1A according to Variation 1 of Embodiment 1 in that power divider 10G has three output terminals and in that filter 18 and low-noise amplifier 19 are added. In what follows, a description of similarities in configuration between front-end circuit 1C and communication device 5C according to the present variation and front-end circuit 1A and communication device 5A according to Variation 1 of Embodiment 1 is omitted, and differences in configuration therebetween are mainly described.

Front-end circuit 1C includes power divider 10G, filters 11, 12, 15, and 18, and low-noise amplifiers 13, 14, 16, and 19.

Power divider 10G is an example of the first power divider, and includes input terminal 10a (first input terminal), output terminal 10b (first output terminal), output terminal 10c (second output terminal), and output terminal 10d (third output terminal). Power divider 10G performs power division on a radio frequency signal inputted to input terminal 10a, using a predetermined division ratio, and outputs a radio frequency signal resulting from the power division from each of output terminals 10b, 10c, and 10d. It should be noted that a division ratio between the power of the radio frequency signal outputted from output terminal 10b, the power of the radio frequency signal outputted from output terminal 10c, and the power of the radio frequency signal outputted from output terminal 10d is 2:1:1 (decreased by 3 dB decreased by 6 dB decreased by 6 dB), for example. However, the division ratio is not limited to this. It should be noted that radio frequency components (a frequency spectrum) of the radio frequency signal outputted from output terminal 10b, radio frequency components (a frequency spectrum) of the radio frequency signal outputted from output terminal 10c, and radio frequency components (a frequency spectrum) of the radio frequency signal outputted from output terminal 10d may be different from each other.

Filter 11 is an example of the first filter, and has a first passband. The first passband corresponds to Band A (communication band A) of 5G NR, for example.

Filter 12 is an example of the second filter, and has a second passband having a frequency range that at least partially overlaps a frequency range of the first passband. The second passband corresponds to Band B (communication band B) of 4G LTE, for example.

Filter 18 is an example of a seventh filter, and has a seventh passband. The seventh passband corresponds to Band C (communication band C) of 4G LTE, for example. Filter 18 has an input end connected to output terminal 10d, and an output end connected to an input end of low-noise amplifier 19. It should be noted that the seventh passband may correspond to communication band C of 5G NR.

According to the above configurations of front-end circuit 1C and communication device 5C according to the present variation, power divider 10G ensures favorable isolation of a radio frequency signal in Band A of 5G NR and a radio frequency signal in Band B of 4G LTE that have frequency bands at least partially overlapping each other, and further ensures isolation of these radio frequency signals and a radio frequency signal in Band C of 4G LTE. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals.

[1.6 Configurations of Front-End Circuit 1D and Communication Device 5D According to Variation 5]

Figure 8:
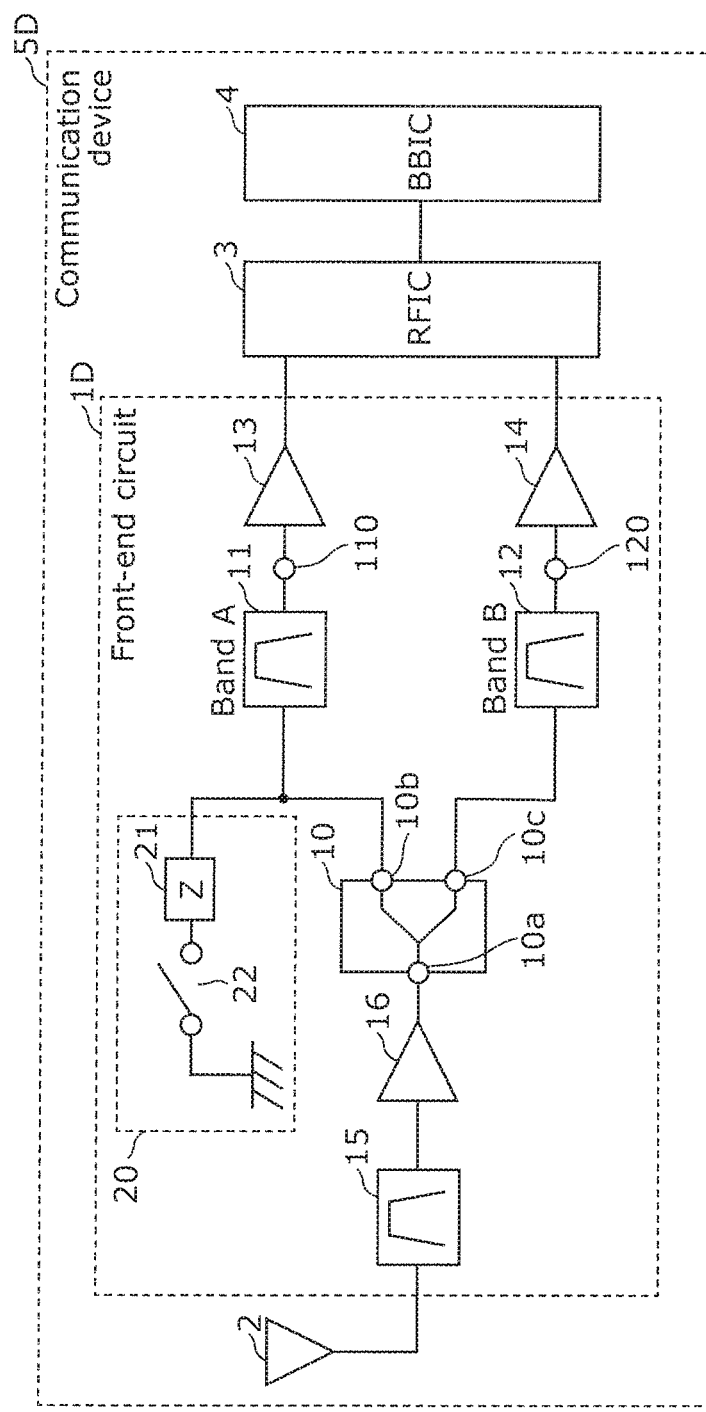
FIG. 8 is a circuit configuration diagram illustrating a front-end circuit and a communication device according to Variation 5 of Embodiment 1.

FIG. 8 is a circuit configuration diagram illustrating front-end circuit 1D and communication device 5D according to Variation 5 of Embodiment 1. As illustrated in FIG. 8, communication device 5D includes front-end circuit 1D, antenna 2, RFIC 3, and BBIC 4. Communication device 5D according to the present variation differs from communication device 5A according to Variation 1 of Embodiment 1 only in the configuration of front-end circuit 1D. Front-end circuit 1D according to the present variation differs from front-end circuit 1A according to Variation 1 of Embodiment 1 in that impedance-tunable circuit 20 is added. In what follows, a description of similarities in configuration between front-end circuit 1D and communication device 5D according to the present variation and front-end circuit 1A and communication device 5A according to Variation 1 of Embodiment 1 is omitted, and differences in configuration therebetween are mainly described.

Front-end circuit 1D includes power divider 10, filters 11, 12, and 15, low-noise amplifiers 13, 14, and 16, and impedance-tunable circuit 20.

Impedance-tunable circuit 20 is connected to output terminal 10b of power divider 10. Impedance-tunable circuit 20 includes impedance element 21 and switch 22 connected to impedance element 21. Impedance element 21 may be, for example, at least one of an inductor or a capacitor.

Switch 22 is switched between a conducting state and a non-conducting state in accordance with, for example, at least one of (1) a change of a frequency (communication band) of a radio frequency signal transferred through front-end circuit 1D, (2) a change of the receiving sensitivity of front-end circuit 1D, or (3) a change of the antenna sensitivity of antenna 2.

With this, since it is possible to optimize an impedance match between power divider 10, filter 11, and low-noise amplifier 13 in accordance with at least one of the above (1), (2), or (3), it is possible to improve the receiving sensitivity of front-end circuit 1D and communication device 5D.

It should be noted that impedance-tunable circuit 20 may be connected to output terminal 10c or input terminal 10a of power divider 10.

Embodiment 2

The present embodiment illustrates a front-end circuit formed by combining the front-end circuits according to Embodiment 1 and the variations thereof.

[2.1 Configurations of Front-End Circuit 1E and Communication Device 5E]

Figure 9:
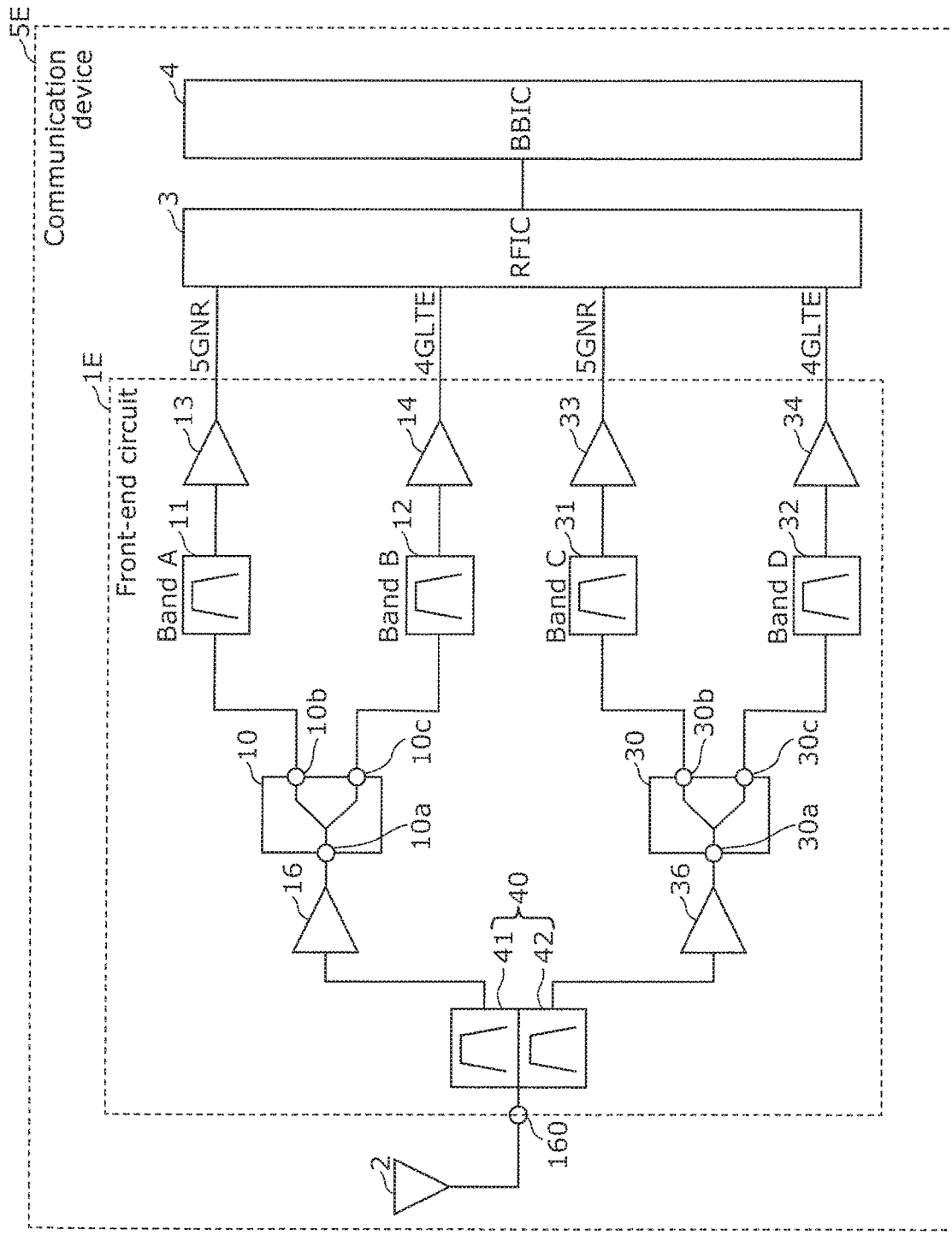
FIG. 9 is a circuit configuration diagram illustrating a front-end circuit and a communication device according to Embodiment 2.

FIG. 9 is a circuit configuration diagram illustrating front-end circuit 1E and communication device 5E according to Embodiment 2. As illustrated in FIG. 9, communication device 5E includes front-end circuit 1E, antenna 2, RFIC 3, and BBIC 4. Communication device 5E according to the present embodiment differs from communication device 5A according to Variation 1 of Embodiment 1 only in the configuration of front-end circuit 1E. Front-end circuit 1E according to the present embodiment differs from front-end circuit 1A according to Variation 1 of Embodiment 1 in including two front-end circuits 1A. In what follows, a description of similarities in configuration between front-end circuit 1E and communication device 5E according to the present embodiment and front-end circuit 1A and communication device 5A according to Variation 1 of Embodiment 1 is omitted, and differences in configuration therebetween are mainly described.

Front-end circuit 1E includes power dividers 10 and 30, filters 11, 12, 31, and 32, low-noise amplifiers 13, 14, 16, 33, 34, and 36, diplexer 40, and antenna terminal 160.

Antenna terminal 160 is connected to antenna 2.

Diplexer 40 includes filters 41 and 42. Filter 41 is an example of the third filter, and has a third passband. The third passband encompasses the first passband of filter 11 and the second passband of filter 12. Filter 42 is an example of a fourth filter, and has a fourth passband that does not overlap the third passband. The fourth passband encompasses a fifth passband of filter 31 and a sixth passband of filter 32. Filters 41 and 42 each have an input end connected to antenna terminal 160. It should be noted that diplexer 40 may be a triplexer or multiplexer that includes at least three filters having passbands that do not overlap each other.

In other words, front-end circuit 1E has a configuration in which two front-end circuits 1A according to Variation 1 of Embodiment 1 that are connected to diplexer 40. This configuration makes it possible to simultaneously transfer, together with a radio frequency signal having passed through filter 11 and a radio frequency signal having passed through filter 12, a radio frequency signal having passed through filter 42 and having a frequency range different from frequency ranges of the radio frequency signals having passed through filters 11 and 12.

Low-noise amplifier 16 has an output end connected to input terminal 10a of power divider 10, and an input end connected to an output end of filter 41.

Power divider 30 is an example of a second power divider, and includes input terminal 30a (second input terminal), output terminal 30b (third output terminal), and output terminal 30c (fourth output terminal). Power divider 30 performs power division on a radio frequency signal inputted to input terminal 30a, using a predetermined division ratio, and outputs one of radio frequency signals resulting from the power division from output terminal 30b, and the other of the radio frequency signals from output terminal

30c. It should be noted that a division ratio between the power of the radio frequency signal outputted from output terminal 30b and the power of the radio frequency signal outputted from output terminal 30c is 1:1 (each decreased by 3 dB), for example. However, the division ratio is not limited to this. It should be noted that radio frequency components (a frequency spectrum) of the radio frequency signal outputted from output terminal 30b are identical to radio frequency components (a frequency spectrum) of the radio frequency signal outputted from output terminal 30c.

Filter 31 is an example of a fifth filter, and has a fifth passband. The fifth passband corresponds to Band C (communication band C), for example. Filter 31 has an input end connected to output terminal 30b, and an output end connected to an input end of low-noise amplifier 33.

Filter 32 is an example of a sixth filter, and has a sixth passband having a frequency range that at least partially overlaps a frequency range of the fifth passband. The sixth passband corresponds to Band D (communication band D), for example. Filter 32 has an input end connected to output terminal 30c, and an output end connected to an input end of low-noise amplifier 34.

It should be noted that filters 31, 32, 41, and 42 may each be, for example, any of an acoustic wave filter that uses SAWs, an acoustic wave filter that uses BAWs, an LC resonant filter, an LC resonant circuit including an acoustic wave resonator, and a dielectric filter. Further, filters 31, 32, 41, and 42 are not limited to these.

Low-noise amplifier 33 preferentially amplifies a radio frequency signal in the fifth passband outputted from filter 31. Low-noise amplifier 34 preferentially amplifies a radio frequency signal in the sixth passband outputted from filter 32. Low-noise amplifier 36 is an example of a fourth low-noise amplifier, and preferentially amplifies a radio frequency signal in the fourth passband outputted from filter 42. Low-noise amplifiers 33, 34, and 36 are each configured as, for example, a Si CMOS, a GaAs field-effect transistor (FET), or a hetero bipolar transistor (HBT).

Low-noise amplifier 36 has an output end connected to input terminal 30a of power divider 30, and an input end connected to an output end of filter 42.

In front-end circuit 1E and communication device 5E according to the present embodiment, two 4G LTE transfer circuits and two 5G NR transfer circuits are connected to one antenna 2. The 4G LTE transfer circuits are, for example, a circuit including output terminal 10c, filter 12, and low-noise amplifier 14, and a circuit including output terminal 30c, filter 32, and low-noise amplifier 34. The 5G NR transfer circuits are, for example, a circuit including output terminal 10b, filter 11, and low-noise amplifier 13, and a circuit including output terminal 30b, filter 31, and low-noise amplifier 33.

For example, Band 41 (transmission and receiving band: 2496 to 2690 MHz) of 4G LTE is applied to Band B (second passband), and n 41 (transmission and receiving band: 2496 to 2690 MHz) of 5G NR is applied to Band A (first passband). In this case, Band B (second passband) and Band A (first passband) have the same frequency range.

Moreover, for example, Band 39 (transmission and receiving band: 1880 to 1920 MHz) of 4G LTE is applied to Band D, and n 39 (transmission and receiving band: 1880 to 1920 MHz) of 5G NR is applied to Band C. In this case, Band D and Band C have the same frequency range.

It should be noted that Band B (second passband) and Band A (first passband) have frequency ranges that may include an overlapping portion and non-overlapping portions, and Band D and Band C have the frequency ranges that may include an overlapping portion and non-overlapping portions.

According to the above configurations of front-end circuit 1E and communication device 5E according to the present embodiment, power divider 10 ensures favorable isolation of a radio frequency signal in communication band A and a radio frequency signal in communication band B that have frequency bands at least partially overlapping each other. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals. Moreover, power divider 30 ensures favorable isolation of a radio frequency signal in communication band C and a radio frequency signal in communication band D that have frequency bands at least partially overlapping each other. Accordingly, when the passbands of filters 31 and 32 at least partially overlap each other, the configurations make it possible to simultaneously transfer a radio frequency signal having passed through filter 31 and a radio frequency signal having passed through filter 32 while reducing mutual interference between the radio frequency signals.

Furthermore, the above configurations make it possible to achieve (1) EN-DC by two bands of communication band A (5G NR) and communication band B (4G LTE), (2) EN-DC by two bands of communication band C (5G NR) and communication band D (4G LTE), and (3) EN-DC by four bands of communication band A (5G NR), communication band C (5G NR), communication band B (4G LTE), and communication band D (4G LTE). Consequently, it is possible to increase options for communication bands when EN-DC is performed.

[2.2 Configurations of Front-End Circuit 1F and Communication Device 5F According to Variation]

Figure 10:
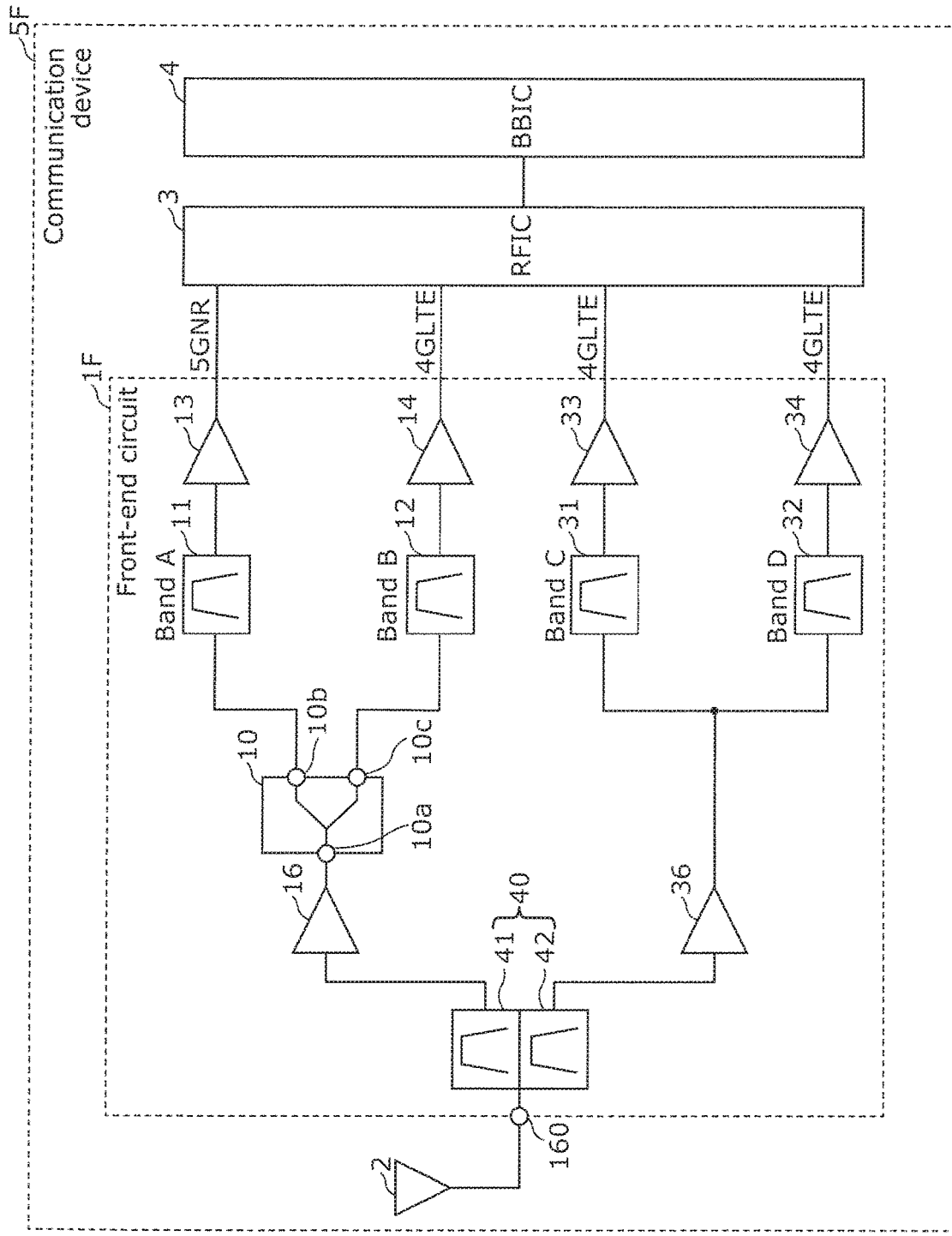
FIG. 10 is a circuit configuration diagram illustrating a front-end circuit and a communication device according to a variation of Embodiment 2.

FIG. 10 is a circuit configuration diagram illustrating front-end circuit 1F and communication device 5F according to a variation of Embodiment 2. As illustrated in FIG. 10, communication device 5F includes front-end circuit 1F, antenna 2, RFIC 3, and BBIC 4. Communication device 5F according to the present variation differs from communication device 5E according to Embodiment 2 only in the configuration of front-end circuit 1F. Front-end circuit 1F according to the present variation differs from front-end circuit 1E according to Embodiment 2 in that power divider 30 is not disposed. In what follows, a description of similarities in configuration between front-end circuit 1F and communication device 5F according to the present variation and front-end circuit 1E and communication device 5E according to Embodiment 2 is omitted, and differences in configuration therebetween are mainly described.

Front-end circuit 1F includes power divider 10, filters 11, 12, 31, and 32, low-noise amplifiers 13, 14, 16, 33, 34, and 36, diplexer 40, and antenna terminal 160.

Filter 31 has an input end connected to an output end of low-noise amplifier 36, and an output end connected to an input end of low-noise amplifier 33. Filter 32 has an input end connected to the output end of low-noise amplifier 36, and an output end connected to an input end of low-noise amplifier 34.

In front-end circuit 1F and communication device 5F according to the present variation, three 4G LTE transfer circuits and one 5G NR transfer circuit are connected to one antenna 2. The 4G LTE transfer circuits are, for example, a circuit including output terminal 10c, filter 12, and low-noise amplifier 14, a circuit including filter 31 and low-noise amplifier 33, and a circuit including filter 32 and low-noise amplifier 34. The 5G NR transfer circuit is, for example, a circuit including output terminal 10b, filter 11, and low-noise amplifier 13.

For example, n 28 (receiving band: 758 to 803 MHz) of 5G NR is applied to Band A (first passband), and Band 20 (receiving band: 791 to 892 MHz) of 4G LTE is applied to Band B (second passband). In this case, Band B (second passband) and Band A (first passband) have the frequency ranges that include an overlapping portion and non-overlapping portions.

Moreover, for example, Band 7 (receiving band: 2620 to 2690 MHz) of 4G LTE is applied to Band C, and Band 3 (receiving band: 1805 to 1880 MHz) of 4G LTE is applied to Band D. In this case, Band C and Band D have the frequency ranges that do not overlap each other. In addition, both sets of Band C and Band D and Band A and Band B have the frequency ranges that do not overlap each other. It should be noted that Band A (first passband) and Band B (second passband) may have the same frequency range.

According to the above configurations of front-end circuit 1F and communication device 5F according to the present variation, power divider 10 ensures favorable isolation of a radio frequency signal in communication band A and a radio frequency signal in communication band B that have frequency bands at least partially overlapping each other. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals. In addition, the configurations make it possible to perform simultaneous reception (carrier aggregation (CA)) of a radio frequency signal in communication band C and a radio frequency signal in communication band D that have frequency ranges that do not overlap the frequency ranges of communication band A and communication band B.

Furthermore, the above configurations make it possible to achieve (1) EN-DC by two bands of communication band A (5G NR) and communication band B (4G LTE), (2) CA by two bands of communication band C (4G LTE) and communication band D (4G LTE), and (3) EN-DC and CA by four bands of communication band A (5G NR), communication band B (4G LTE), communication band C (4G LTE), and communication band D (4G LTE). As a result, it is possible to increase options for communication bands to be simultaneously used. It should be noted that in the case of above (2), low-noise amplifiers 13 and 14 may be turned OFF. With this, in the case of above (2), even when an EN-DC transfer circuit is connected, it is possible to reduce impact on communication band C and communication band D for performing CA.

Other Embodiments

Although the front-end circuit and the communication device according to the present disclosure have been described above using the embodiments and the variations, the front-end circuit and the communication device according to the present disclosure are not limited to the above embodiments and variations. The present disclosure also contains other embodiments realized by combining any constituent elements in the above embodiments and variations, variations obtained by making various modifications to the above embodiments and variations that can be conceived by a person with an ordinary skill in the art without departing from the scope of the present disclosure, and various devices that include the front-end circuit and the communication device according to the above embodiments and variations.

It should be noted that, as stated above, the front-end circuit and the communication device according to the above embodiments and variations are used for a communication system such as a 3GPP system, and are used typically for a system that simultaneously transfers the 4G LTE radio frequency signal and the 5G NR radio frequency signal described in the embodiments. Examples of a combination of 4G LTE and 5G NR include (1) Band 41 and n 41 described in the embodiments, (2) Band 71 and n 71, and (3) Band 3 and n 3.

Moreover, the front-end circuit and the communication device according to the above embodiments and variations are also used for a communication system that is not a 3GPP system. Examples of a combination of a signal in Band A passing through the first filter and a signal in Band B passing through the second filter include (1) a wireless local area network (WLAN) and a 4G-LTE unlicensed band, (2) WLAN and a 5G-NR unlicensed band (5G-NR-U), and (3) a licensed band and an unlicensed band. In above (3), that a communication system for the licensed band and a communication system for the unlicensed band are different means that output regulations for transmission power are different, for example. Further, above (1) to (3) can be used for communication schemes where different communication systems simultaneously transmit two different signals include carrier sense.

In other words, the front-end circuit and the communication device according to the above embodiments and variations can be used for any communication system and any communication band, and can be also used for a millimeter band.

Furthermore, for example, in the front-end circuit and the communication device according to the above embodiments and variations, another radio frequency circuit element, a wire, etc. may be disposed between paths connecting the circuit elements and the signal paths illustrated in the figures.

Moreover, although the front-end circuit and the communication device according to the above embodiments and variations are a receiver circuit that transfers a radio frequency signal received by antenna 2, the front-end circuit and the communication device according to the above embodiments and variations are also used as a transmission circuit that transfers a radio frequency signal generated by RFIC 3 and transmits the radio frequency signal from antenna 2. In this case, for example, in front-end circuit 1 and communication device 5 illustrated in FIG. 1, power amplifiers are disposed in place of low-noise amplifiers 13 and 14.

Figure 11:
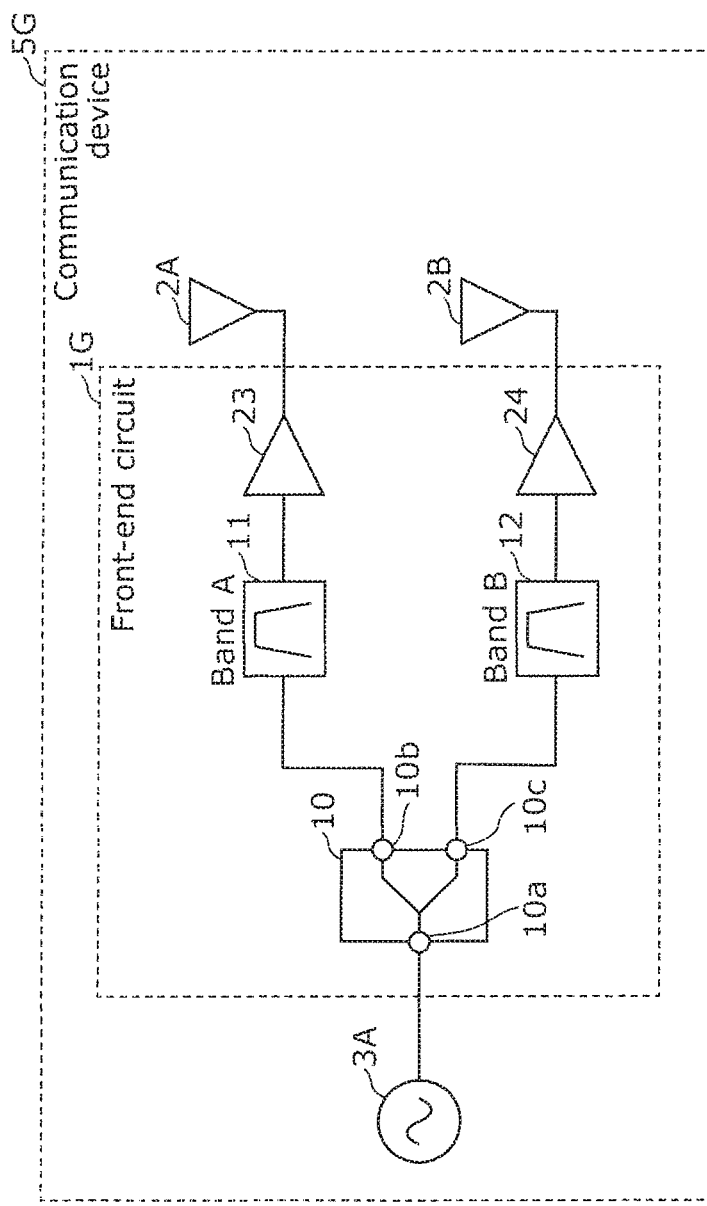
FIG. 11 is a circuit configuration diagram illustrating a front-end circuit and a communication device according to Variation 6 of Embodiment 1.

FIG. 11 is a circuit configuration diagram illustrating front-end circuit 1G and communication device 5G according to Variation 6 of Embodiment 1. Front-end circuit 1G illustrated in FIG. 11 is an example of a transmission circuit that transfers radio frequency signals generated by a signal generator such as an RFIC, and transmits the radio frequency signals from antennas 2A and 2B. In front-end circuit 1G and communication device 5G, power amplifiers 23 and 24 are disposed in place of low-noise amplifiers 13 and 14.

Front-end circuit 1G includes: power divider 10 that includes input terminal 10a and output terminals 10b and 10c, and performs power division on a radio frequency signal inputted to input terminal 10a, using a predetermined division ratio, and outputs resultant radio frequency signals from output terminals 10b and 10c; filter 11 connected to output terminal 10b and having a first passband; and filter 12 connected to output terminal 10c and having a second passband having a frequency range that at least overlaps a frequency range of the first passband. Communication device 5G includes signal generator 3A that processes radio frequency signals to be transmitted from antennas 2A and 2B, and front-end circuit 1G that transfers radio frequency signals between antennas 2A and 2B and signal generator 3A.

According to the above configurations of front-end circuit 1G and communication device 5G according to the present variation, power divider 10 ensures favorable isolation of a radio frequency signal in communication band A and a radio frequency signal in communication band B that have frequency bands at least partially overlapping each other. Accordingly, when the passbands of filters 11 and 12 at least partially overlap each other, the configurations make it possible to simultaneously transfer a radio frequency signal having passed through filter 11 and a radio frequency signal having passed through filter 12 while reducing mutual interference between the radio frequency signals.

It should be noted that front-end circuit 1G and communication device 5G can be used for transfer of a signal in a millimeter band greater than or equal to 7 GHz. In this case, it is desirable that filters 11 and 12 each include a distributed constant resonant line.

The controller according to the present disclosure may be realized as an integrated circuit (IC) or large scale integration (LSI). Furthermore the method of implementation of structural elements using an integrated circuit may be realized using a dedicated circuit or a general-purpose processor. A field programmable gate array (FPGA) that allows for programming after the manufacture of an LSI, or a reconfigurable processor that allows for reconfiguration of connection and the setting of circuit cells inside an LSI may be employed. When circuit integration technology that replaces LSIs comes along owning to advances of the semiconductor technology or to a separate derivative technology, the function blocks may understandably be integrated using that technology.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a front-end circuit and a communication device that simultaneously transfer radio frequency signals of at least two different communication systems.

The invention claimed is:
1. A front-end circuit, comprising:
a first power divider comprising a first input terminal, a first output terminal, and a second output terminal, and configured to perform power division on a first radio frequency signal inputted to the first input terminal based on a first predetermined division ratio, and to output a first resultant radio frequency signal from each of the first output terminal and the second output terminal;
a first filter that is connected to the first output terminal and that has a first passband; and
a second filter that is connected to the second output terminal and that has a second passband, the second passband at least partially overlapping the first passband.

2. The front-end circuit according to claim 1, further comprising:
a first low-noise amplifier; and
a second low-noise amplifier, wherein:
the first low-noise amplifier has an input connected to an output of the first filter, and
the second low-noise amplifier has an input connected to an output of the second filter.

3. The front-end circuit according to claim 2, wherein the predetermined division ratio of the first power divider, a gain of the first low-noise amplifier, a gain of the second low-noise amplifier, the first passband, or the second passband, changes dynamically.

4. The front-end circuit according to claim 1, further comprising:
a third low-noise amplifier; and
a third filter, the third filter having a third passband that encompasses the first passband and the second passband, wherein:
the third low-noise amplifier has an output connected to the first input terminal, and
the third low-noise amplifier has an input connected to an output of the third filter.

5. The front-end circuit according to claim 4, wherein a gain of the third low-noise amplifier or the third passband changes dynamically.

6. The front-end circuit according to claim 4, further comprising:
an antenna terminal connected to an antenna; and
a fourth filter having a fourth passband that does not overlap the third passband,
wherein the third filter and the fourth filter each have an input connected to the antenna terminal.

7. The front-end circuit according to claim 6, further comprising:
a fourth low-noise amplifier; and
a second power divider comprising a second input terminal, a third output terminal, and a fourth output terminal, and configured to perform power division on a second radio frequency signal inputted to the second input terminal based on a second predetermined division ratio, and to output a second resultant radio frequency signal from each of the third output terminal and the fourth output terminal;
a fifth filter that has a fifth passband encompassed by the fourth passband; and
a sixth filter that has a sixth passband encompassed by the fourth passband, the sixth passband at least partially overlapping the fifth passband, wherein:
the fourth low-noise amplifier has an input connected to an output of the fourth filter,
the second input terminal is connected to an output of the fourth low-noise amplifier,
the third output terminal is connected to an input of the fifth filter, and
the fourth output terminal is connected to an input of the sixth filter.

8. The front-end circuit according to claim 1, wherein:
the front-end circuit is configured to support a communication scheme in which different communication systems are used simultaneously, and
the first passband and the second passband have the same frequency range.

9. The front-end circuit according to claim 1, wherein:
the front-end circuit is configured to support a communication scheme in which different communication systems are used simultaneously, and
the first passband and the second passband are at least partially non-overlapping.

10. The front-end circuit according to claim 1, wherein:
the first power divider further comprises a third output terminal, and is configured to output the first resultant radio frequency signal from each of the first output terminal, the second output terminal, and the third output terminal, and
the front-end circuit further comprises a seventh filter that is connected to the third output terminal and that has a seventh passband.

11. The front-end circuit according to claim 1, further comprising:
an impedance-tunable circuit that is connected to the first power divider, the impedance-tunable circuit comprising:
an impedance element; and
a switch that is connected to the impedance element,
wherein the switch is configured to be selectively switched in accordance with a frequency of the radio frequency signal, a receiving sensitivity of the front-end circuit, or an antenna sensitivity of an antenna connected to the front-end circuit.

12. A communication device, comprising:
the front-end circuit according to claim 1; and
a radio frequency (RF) signal processing circuit configured to process the first resultant radio frequency signal, the first resultant radio frequency signal being transmitted or received by an antenna,
wherein the front-end circuit is configured to transfer the first radio frequency signal between the antenna and the RF signal processing circuit.

13. The front-end circuit according to claim 1, wherein the first power divider is a hybrid of a transformer power divider and a resistor power divider.

14. The front-end circuit according to claim 13, wherein the first power divider further comprises:
an input transformer connected to the first input terminal;
an output transformer connected to the first output terminal and to the second output terminal; and
a resistor connected between the first output terminal and the second output terminal.

15. The front-end circuit according to claim 14,
wherein a node of the input transformer is connected to an intermediate node of the output transformer, and
wherein the first power divider further comprises a capacitor connected between ground and the intermediate node of the output transformer and the node of the input transformer.

16. The front-end circuit according to claim 15, wherein the intermediate node of the output transformer has a transformed impedance of 100 Ohms, the node of the input transformer has a transformed impedance from 25 Ohms to 50 Ohms, and the resistor has an impedance of 100 Ohms.

17. The front-end circuit according to claim 1, wherein the first power divider is a Wilkinson power divider.

18. The front-end circuit according to claim 17, wherein the first power divider further comprises:
a first stripline connected between the first input terminal and the first output terminal;
a second stripline connected between the first input terminal and the second output terminal; and
a resistor connected between the first output terminal and the second output terminal.

19. The front-end circuit according to claim 18,
wherein first radio frequency signal has a frequency of at least several GHz, and
wherein the first and second striplines have a length of ¼ of a wavelength of the first radio frequency signal.

20. The front-end circuit according to claim 1, further comprising:
a first power amplifier; and
a second power amplifier, wherein:
the first power amplifier has an input connected to an output of the first filter,
the second power amplifier has an input connected to an output of the second filter, and
outputs of the first and second power amplifiers are connected to at least one antenna.

* * * * *

UNITED STATES PATENT AND TRADEMARK OFFICE
CERTIFICATE OF CORRECTION

PATENT NO. : 11,239,873 B2
APPLICATION NO. : 16/830992
DATED : February 1, 2022
INVENTOR(S) : Mori Page 1 of 1

It is certified that error appears in the above-identified patent and that said Letters Patent is hereby corrected as shown below:

In the Specification

Column 4, Line 36, "105" should be -- 10S --.

Column 4, Line 38, "105 includes" should be -- 10S --.

Signed and Sealed this
Thirteenth Day of September, 2022

Katherine Kelly Vidal
*Director of the United States Patent and Trademark Office*